United States Patent [19]

George

[11] 4,346,454
[45] Aug. 24, 1982

[54] BUBBLE MEMORY WITH ON CHIP ERROR MAP STORAGE ON PERMALLOY DISK ELEMENTS

[75] Inventor: Peter K. George, Morgan Hill, Calif.

[73] Assignee: National Semiconductor Corporation, Santa Clara, Calif.

[21] Appl. No.: 180,312

[22] Filed: Aug. 22, 1980

[51] Int. Cl.³ .............................................. G11C 19/08
[52] U.S. Cl. ........................................ 365/15; 365/12; 365/17; 365/41
[58] Field of Search ....................... 365/15, 16, 17, 41, 365/12

[56] References Cited

U.S. PATENT DOCUMENTS

| | | | |
|---|---|---|---|
| 4,145,757 | 3/1979 | Bonnie | 365/12 |
| 4,156,937 | 5/1979 | Bonnie | 365/12 |
| 4,187,554 | 2/1980 | Kammann | 365/15 |

Primary Examiner—James W. Moffitt
Attorney, Agent, or Firm—Gail W. Woodward; James A. Sheridan; Neil B. Schulte

[57] ABSTRACT

A bubble memory chip includes a plurality of data loops, some of which may be defective, for storing magnetic bubbles representative of data therein. A serial-parallel input propagation path and a parallel-serial output propagation path are provided for propagating bubbles to and from the data loops. A plurality of spaced apart permalloy disk elements are provided, each adapted for having a single bubble circulated thereabout in the presence of an in-plane rotating magnetic drive field. A stream of bubbles representative of an error map indicating which of the data loops are defective is loaded onto and read from the disk elements to initialize the memory. A plurality of gates permit the bubbles of the error map to be transferred between an error map propagation path and the disk elements in parallel fashion upon pulsing of an adjacent control conductor. The potential for data scrambling in the error map is eliminated. Power consumption and access time are reduced in connection with reading and propagating the error map through the detector to initialize the memory.

1 Claim, 3 Drawing Figures

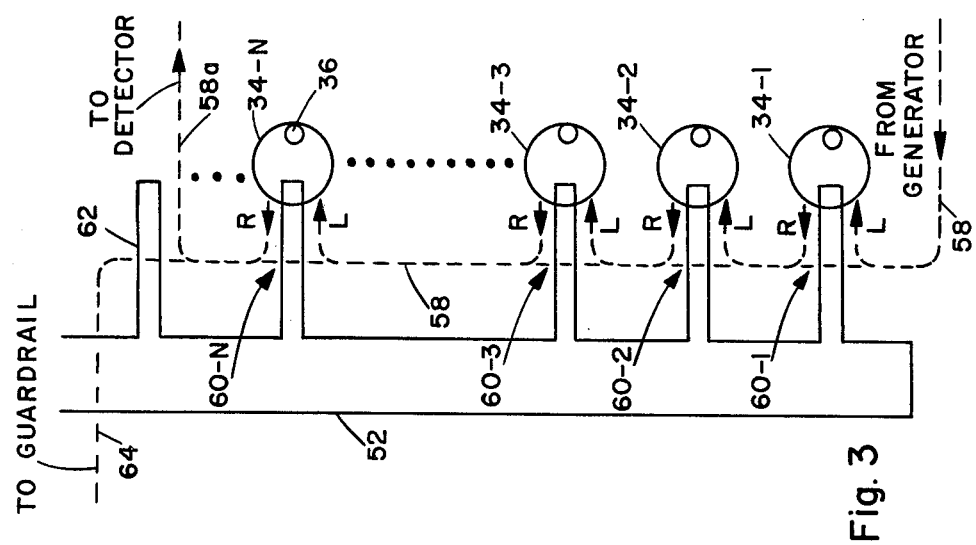
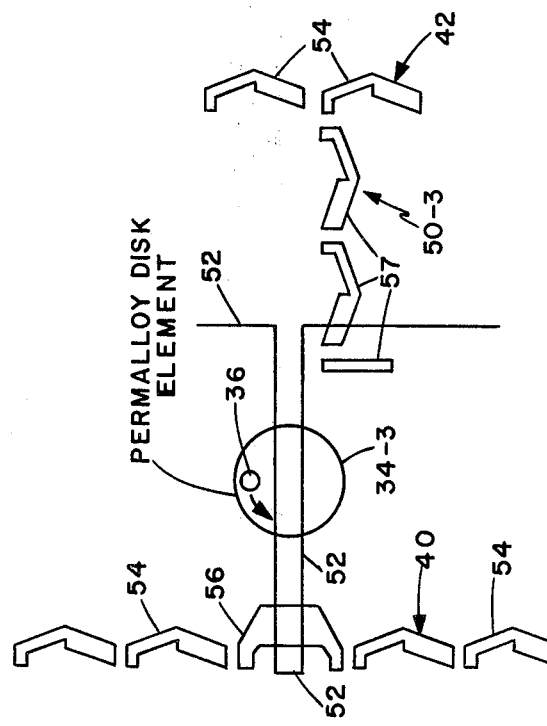

BUBBLE MEMORY WITH ON CHIP ERROR MAP STORAGE ON PERMALLOY DISK ELEMENTS

BACKGROUND OF THE INVENTION

The present invention relates to bubble memories, and more particularly to methods and apparatus for dealing with defective data storage loops in such memories.

Presently, the most popular architecture for a bubble memory includes a plurality of minor loops for storing bubbles representative of data therein. The bubbles are written into these minor loops and read therefrom in response to control signals applied to the memory. However, due to a variety of reasons a small number of the loops, such as five or ten percent, typically are defective. These defects may be due to flaws in the garnet film in which the bubbles are formed. They may also be due to permalloy defects arising from dust which enters the memory during the photolithographic stage of its fabrication. Defective data storage loops may also result from shorts between adjacent permalloy propagation elements which define the loops. A permalloy short creates a barrier to bubble propagation and renders a loop containing the short inoperable. Permalloy shorts occur randomly and are more of a problem when fabrication tolerances approach the resolution limit of the photolithography.

Thus, in order to construct high yield bubble memory chips, it is necessary to provide extra data storage loops on the chip. Then, during final chip testing, the defective loops are determined, and this information is subsequently used to control which loops are actually used to store bubbles.

In one prior art solution to the problem, defective loops have been identified to the user by stamping a defective loop map on each of the packages. The user has then encoded this information into a read only memory (ROM). The ROM was then used in conjunction with other control logic to mask out the defective loops during write or read operations.

U.S. Pat. No. 4,073,012 discloses a data relocation technique for overcoming the problem of defective minor loops in a bubble memory chip. It provides for coding the information to be stored in the memory by inserting zeros in the data stream so as to avoid the storage of meaningful bits into defective minor loops. A ROM on the chip is used to store positions of the defective minor loops.

U.S. Pat. No. 3,909,810 discloses a redundancy bubble memory system designed to operate with a plurality of data chips having a major-minor loop configuration where in some of the minor loops are defective. A plurality of data chips are interconnected to form a shift register and the data chips communicate with a flag chip of similar organization. Data is detected from the flag chip concurrently with the data chips to prevent any faulty loops on the data chips from being read and used for data storage.

U.S. Pat. No. 4,090,251 discloses another scheme for dealing with defective minor loops in a bubble memory chip. The first page written into the minor loops, where a page is defined as a common bit position in each of the plurality of minor loops, presents a series of magnetic domains and voids. The domains represent the operable minor loops and the voids represent the defective minor loops. The second page in the minor loops is a series of magnetic domains and voids separated into bytes of information which are representative of the loop numbers of defective minor loops on the chip. The third page in the minor loops is a repetition of the first page of data. Collectively, the three pages comprise the on-chip firmware which provides redundancy information. A microprocessor accesses and compares the redundancy patterns stored in the first three pages of the minor loops before it will read or write from the magnetic memory device.

More recently, some bubble memories have included a single extra loop on the chip for storing error map information therein. The user is thus able to read the error map from the memory during system initialization and to store the map in a random access memory (RAM). The RAM is then used in conjunction with control logic to mask out the defective loops during a write or read operation. Published German application No. 2804695 filed by Texas Instruments, Inc. is believed to be representative of this last mentioned approach. For a further discussion of the ROM and RAM approaches to error map storage see pages 35-36 of the book entitled *Magnetic-Bubble Memory Technology* by Hsu Chang, copyright 1978 and published by Marcel Dekker Inc.

All of the foregoing approaches have certain deficiencies. For example, with the ROM approach, each memory system requires unique parts. That is, the ROM in one memory system cannot be used as the ROM in another memory system because the bubble memory chips en each memory system have different defective minor loops. Furthermore, when a bubble memory chip in a memory system goes completely bad, due to aging for example, the replacement of the bubble memory chip also neccessitates the replacement of the ROM. Some of the foregoing approaches require too much redundancy information programming or too much additional circuitry.

One problem with the prior art bubble memory chips that provide an on chip error map storage loop is that they include no redundant error map loops. That is, they include only a single error map loop. Therefore, if that loop is defective, due to any of the above described processing problems, the entire chip must be discarded. Thus, the production yield of those bubble memory chips is undesirably low. This last mentioned problem has been overcome by my co-pending U.S. Patent application Ser. No. 3,651 filed Jan. 15, 1979 and now U.S. Pat. No. 4,228,522 and owned by the assignee of the present application. That application discloses a bubble memory including a plurality of minor loops for storing bubbles representative of information data therein, and a pair of minor loops for storing bubbles representative of an error map therein. The error map is selectively written into and read from only one loop of the pair. The other error map loop is redundant. Thus, if one of the error map loops is defective the entire chip need not be discarded since the other non-defective error map loop can then be utilized.

Heretofore the best approach for dealing with defective minor loops in a bubble memory chip has been to store the error map in an on chip error map loop. However, such an approach is not without its own shortcomings. One of its main disadvantages is that because the stream of bubbles representing the error map are moving in the on chip error map storage loop during rotations of the drive field there is a potential for data scrambling or data loss. To explain more fully, the error map is typically a stream of bubbles with interspersed no-bubble positions therebetween. The presence or absence of a buble in a given position is thus indicative of whether a particular loop is good or bad. This stream is stored in the error map storage loop and is frequently shorter than the length of that loop.

During rotations of the magnetic drive field the error map stream rotates about the error map loop. If the starting and stopping of the rotation of the drive field is not done in precise alignment with reference to the 360° field of rotation, it is possible for magnetic bubbles in the error map to jump between adjacent permalloy propagation elements or collapse after the drive field has stopped rotating. When this happens the logic circuit associated with the bubble memory no longer knows where the error map starts and stops and therefore it cannot read the same. Therefore the logic circuit can no longer distinguish between good and defective minor loops and as a result the information stored in such minor loops is permanently lost.

Another problem with the on-chip error map loop approach is that a significannt amount of time is required to read the error map loop. Generally a leader in the form of a predetermined stream of bubble and no-bubble bit positions must be formed at the beginning of the error map. The leader is a code which tells the logic circuit that the error map follows. In order to read the leader and the error map from the storage loop a control conductor must be pulsed once for each bit position in the leader and the error map, one pulse for every revolution of the drive field. Thereafter the leader and the error map must be propagated to the detector and the logic circuit must search for and read the leader before the error map can be read. Thus, storage of the error map in a loop necessitates both serial access and a relatively large number of control conductor pulses. Parallel access to the error map would be preferable from a systems standpoint since it would take less time to access the error map and a single control conductor pulse could be utilized, resulting in less power consumption.

SUMMARY OF THE INVENTION

It is therefor an object of the present invention to provide a bubble memory with on-chip error map storage region which is not susceptable to data scrambling or data loss.

Another object of the present invention is to provide a bubble memory with on-chip error map storage wherein the error map can be more quickly and accurately accessed with reduced power consumption.

Yet another object of the present invention is to provide a bubble memory having an on-chip error map storage region having a margin that is significantly wider than for the information storage region.

These and other objects are accomplished with the present invention by a bubble memory chip wherein bubbles representative of an error map are stored on a plurality of permalloy disk elements. Each disk element is adapted for having a single bubble circulated there about in the presence of an in-plane rotating magnetic field. In the embodiment disclosed the chip includes a plurality of data loops, some of which may be defective, for storing magnetic bubbles representative of data therein. A serial-parallel input path is provided for propagating bubbles to the data loops. Similarly, a parallel-serial output path is provided for propagating bubbles from the data loops. A plurality of permalloy disk elements are arranged in spaced-apart linear fashion to one side of the data loops. Each of the disk elements may have a diameter substantially equal to the period of the propagation elements in the data loops. Adjacent disk elements may be spaced approximately five microns apart.

An error map propagation path is provided for propagating bubbles representative of an error map indicating which of the data loops are defective. This path includes a first leg and a second leg, which legs extend past the disk elements on opposite sides thereof. The first leg has one end positioned for receiving bubbles from the serial portion of the input path, and the second leg has one end positioned for feeding bubbles onto the serial portion of the output path.

A plurality of load gates are provided for transferring a single bubble from the first leg to one of the disk elements, there being an equal number of the load gates and the disk elements. A plurality of read gates are provided for replicating a single bubble from one of the disk elements onto the second leg, there being an equal number of read gates and disk elements. A control conductor extends adjacent the disk elements, the gates, and the legs of the error map propagation path. It is pulsed separately to load the bubbles of the error map onto the disk elements and thereafter to read the bubbles from the disk elements prior to propagating the error map to the detector.

The previously described bubble memory chip of the present invention can be used in the following manner. The defective data loops can be determined at the factory and an error map consisting of a stream of magnetic bubbles interspersed with no-bubble bit positions can be produced by the bubble generator on the chip with appropriate control signals. Thereafter the error map can be propagated down the serial portion of the input path and up the first leg of the error map propagation path until it is in precise alignment with the adjacent line of permalloy disk elements. Thereafter a load signal can be applied to the control conductor adjacent the disk elements to transfer the bubbles of the error map stream onto adjacent disk elements. Each disk will either have a magnetic bubble stored thereon or no bubble at all.

During a write or read operation the memory is first initialized by applying the appropriate read signal to the control conductor so that the error map stored on the permalloy disks is simultaneously accessed in parallel fashion. Thereafter a predetermined number of revolutions of the drive field will take place in order to propagate the error map to the bubble detector on the chip. The detector can automatically begin reading the error map after this predetermined number of revolutions has occurred. The control logic is then used to mask out the defective loops during the subsequent write or read operation. For example, during a write operation information data will be generated in preprogrammed cycles such that the data on the input propagation path will align only with the non-defective loops. During the information write or read operations the magnetic bubbles of the error map will remain circulating about the peripheries of the respective disk elements upon which they are stored.

Because the bubbles of the error map propagate around and not between individual disk elements, the potential for data scrambling is eliminated. Furthermore, because the circulating bubbles do not cross gaps, their intrinsic margin will be much wider than for bubbles circulating in the minor loops. Also, due to the large mass of permalloy in the disk elements, they are inherently high yield elements. One pulse on the control conductor adjacent the disk elements will replicate all of the magnetic bubbles on the disk elements onto the adjacent error map propagation path leading directly to the detector. Therefore power consumption is minimized since multiple pulses during successive field revolutions are not required to read the map. In addition, this single pulse will always replicate the error map in the same place so that a predetermined number of drive field revolutions will thereafter bring the map to the detector. Therefore a leader on the error map is not required.

BRIEF DESCRIPTION OF THE DRAWINGS

Other objects and advantages of the present invention will become more apparent from the following detailed description of preferred embodiments thereof taken in conjunction with the accompanying drawings in which:

FIG. 2 is a greatly enlarged, simplified top view of a portion of the error map storage region in the memory of FIG. 1.

FIG. 3 is a schematic diagram of an error map storage region for a bubble memory chip constructed in accordance with a second embodiment of the present invention.

DESCRIPTION OF THE PREFERRED EMBODIMENTS

Figure 1:
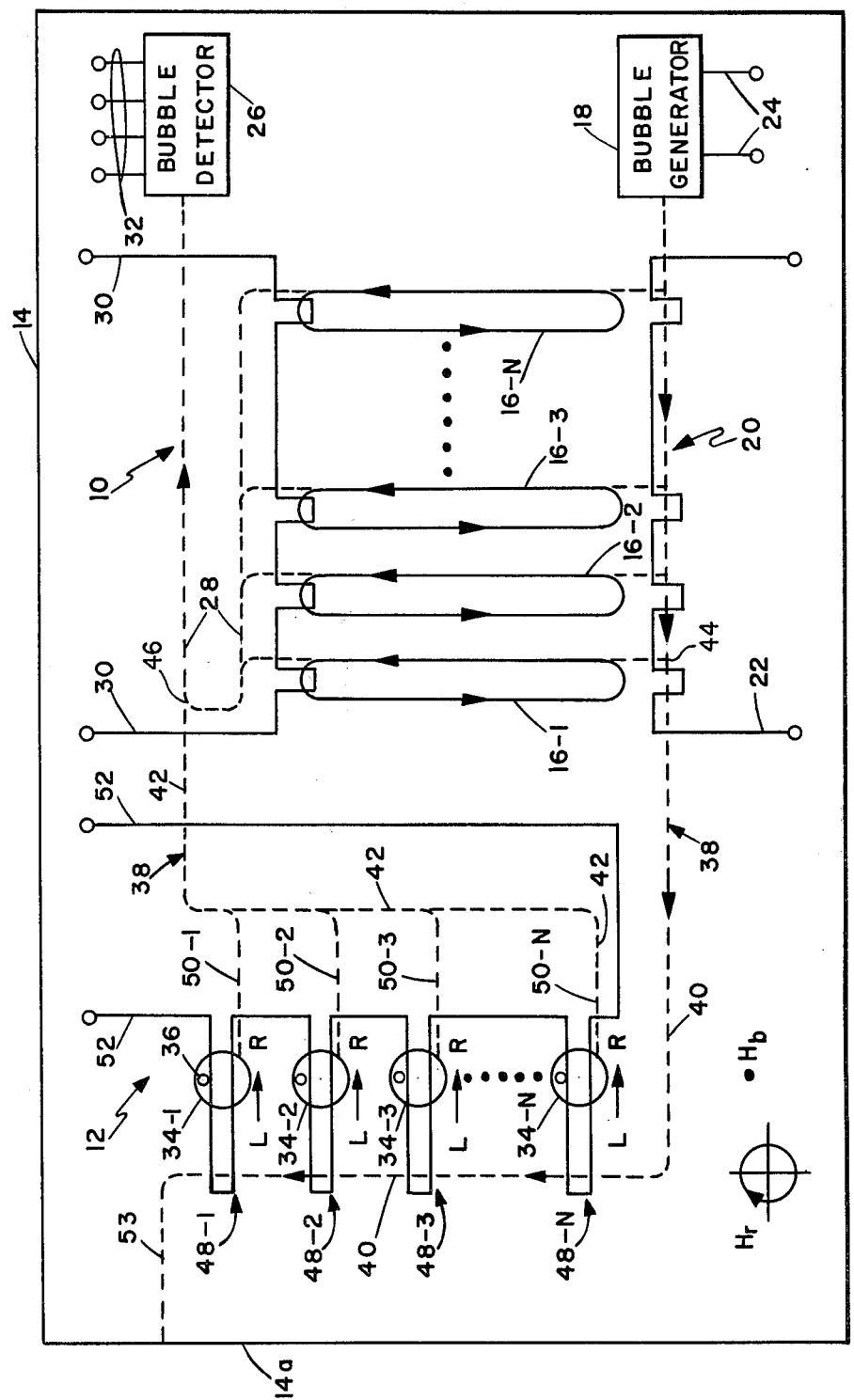
FIG. 1 is a schematic diagram of a bubble memory chip constructed in accordance with a first embodiment of the invention.

The first embodiment of the first invention will now be described in conjunction with FIG. 1. As illustrated therein, this embodiment has an information storage region generally designated with the reference numeral 10 and an error map storage region generally designated with the reference numeral 12. In actual physical construction the bubble memory illustrated schematically in FIG. 1 comprises a single flat chip 14 which is very small, e.g. It may measure 400 mils on a side. The chip includes a thin magnetic film of orthoferrite or garnet. Typically overlying this magnetic film are an insulating layer made of a material such as silicon dioxide, on top of which are a pattern of control conductors made of a material such as ALCu. Typically another insulating layer overlies the pattern of control conductors. On top of this second insulating layer lies a plurality of patterned permalloy regions which are shaped and positioned to form various propagation paths and storage loops.

In the presence of a steady Z bias magnetic field $H_b$ of suitable strength, with its lines of force perpendicular to the plane of the magnetic film, domains of one polarization are stable within a larger area of the opposite polarization. These domains, called magnetic bubbles, can be moved in the plane of the film i.e. propagated along the paths defined by the permalloy elements by applying XY in-plane rotating magnetic drive field $H_r$.

In the bubble memory of FIG. 1 the information storage region 10 has what is known in the art as a block replicate architecture. Specifically it includes a plurality of data loops 16-1 through 16-N. The number of these data loops may be relative large, e.g. in excess of 256. Magnetic bubbles representative of data are stored in these loops. Preferrably the propagation elements are C-bars or assymetric chevrons since they produce a bubble memory with a superior margin and information storage density. The period of the elements defining the data loops, i.e. the length thereof between their side edges, is as small as possible within the limits imposed by photolithographic accuracy. For example, currently a preferred period for the propagation elements which define the data loops is approximately eight microns.

In order to write bubbles into the described data loops, the disclosed invention includes a bubble generator 18, a serial-parallel bubble propagation path 20, and a transfer-in control conductor 22. The bubble generator 18 produces a data stream, in the form of a sequence of magnetic bubbles interspersed with no-bubble bit positions, on the serial portion of the path 20 in response to generate control signals applied to leads 24. These magnetic bubbles propagate along the serial portion of the path 20 in response to the rotating field $H_r$. The position of the data stream along this path can be monitored by the logic circuit associated with the memory since the magnetic bubbles will move a predetermined distance for each rotation of the drive field. To transfer the bubbles in parallel into all of the data loops, a transfer-in control signal is applied to the control conductor 22.

In order to read bubbles from the described data loops, the FIG. 1 bubble memory chip includes a bubble detector 26, a parallel-serial bubble propagation path 28, and a transfer-out control conductor 30. The application of a transfer-out control signal to the conductor 30 causes one bubble from each of the data loops to be replicated and transferred to the parallel inputs of the path 28. It will be understood that where the data stream stored within a particular data loop is stopped in an orientation so that a no-bubble bit position is aligned with the parallel input of the path 28 associated therewith, no bubble will be replicated upon pulsing the transfer-out control conductor 30. The stream of data thus replicated on the path 28 by applying the appropriate signal to the conductor 30 is then propagated by further rotation of the drive field $H_r$ to the bubble detector 26. The detector operates to generate output signals on output leads 32 representative of the sequence of bubble and no-bubble bit positions which it receives during continued rotation of the drive field $H_r$.

Due to causes previously discussed, some of the data loops 16-1 to 16-N may be defective. Where the chip includes a large number of data loops, for example in excess of 256, it is not uncommon for several of the data loops to be defective. These defective loops can be identified at the factory upon completion of the fabrication process. The logic circuit associated with the bubble memory must have a way to identify the defective loops so that information will be written into and read from only the good loops.

According to the present invention, means are provided for storing bubbles representative of an error map indicating which of the data loops are defective. Specifically, the error map storage region 12 includes a plurality of permalloy disk elements 34-1 to 34-N which as shown in FIG. 1. These elements are preferably arranged in spaced-apart linear fashion to one side of the data loops. There are an equal number of the data loops and the disk elements. Each of the disk elements is adapted for having a single bubble circulated thereabout in the presence of the rotating drive field $H_r$. In FIG. 1 a bubble stored on each of the disks is indicated with a small circle 36.

During rotation of the drive field a bubble stored on one of the disk elements will idle by circulating about the periphery of the disk. Preferrably each of the disk elements 34 has a diameter substantially equal to the period of the permalloy propagation elements in the data loops 16. For example, the permalloy disks may measure approximately 8 microns in diameter. Furthermore, the disk elements 34 are preferrably spaced apart from each other and spaced from the nearest permalloy propagation elements a suitable distance, e.g. five microns. This will prevent bubbles from crossing the gaps which exist between adjacent disk elements or between a disk element and an adjacent C-bar or chevron. Due to the large mass of the permalloy in the disk elements the circulating bubbles stored thereon will not cross gaps and thus the potential for data scrambling in the error map is eliminated.

Load/read means are provided for transferring the error map to and from the permalloy disk elements 34. The bubble generator 18 is operated to generate a stream of magnetic bubbles interspersed with no-bubble bit positions which stream is representative of which of the data loops 16 are good and which are defective. For example, a magnetic bubble in this data stream can represent a good data loop and a no-bubble bit position can represent a defective data loop. The positioning of the information within this stream determines which of the data loops to which it applies. In some cases the error map may have an idle bit position between each information position. In other words, between each bubble or no-bubble information position there may be an idle unused bit position for spacing. It is important to for the logic circuit of the memory to keep track of the relative position of the error map as it is generated, propagated, stored, propagated, and detected, in sequence.

An error map propagation path generally designated with the reference numeral 38 in FIG. 1 is provided. This path includes a generally L-shaped first leg 40 and a second generally S-shaped leg 42. The legs 40 and 42 have portions extending past the disk elements 34 on opposite sides thereof. As further described hereafter, the legs of the error map propagation path are preferably formed from C-bar and chevron propagation elements arranged in end to end fashion to form the appropriate pathways for propagating the error map. The first leg 40 has one end 44 positioned for receiving bubbles from the serial portion of the serial-parallel input path 20. The second leg 42 has one end 46 positioned for feeding bubbles onto the serial portion of the parallel-serial output path 28.

The error map is propagated down the path 20, onto the first leg 40 of the error map propagation path until each of its bit positions are in alignment with one of the disk elements 34. A plurality of load gates 48-1 to 48-N are provided for each transferring a single bubble from the first leg to one of the disk elements. It will be understood that there are an equal number of the load gates and the disk elements. Thus the error map is loaded in parallel fashion onto the disk elements in the bubble memory of FIG. 1. Similarly a plurality of read gates 50-1 to 50-N are provided for each replicating a single bubble from one of the disk elements 34 to the second leg 42 of the error map propagation path. Thus parallel access to the error map stored on the disk elements 34 can be obtained. As explained more fully hereafter, preferably the gates include C-bar or chevron permalloy propagation elements. The first and second legs and the load and read gates form a ladder-like configuration in the error map storage region 12.

It will be understood that when the error map is stored on the disk elements 34 some of the disk elements will not have magnetic bubbles stored thereon and such disk elements thus represent the no-bubble bit positions in the error map. An error map control conductor 52 extends adjacent the disk elements 34, the gates 48 and 50, and the legs of the error map propagation path. Finally, an overflow propagation path 53 extends from the upper end of the first leg 40 to a guardrail 14a of the chip.

Simultaneous parallel storing of bubbles on the disk elements and thereafter simultaneous parallel access to bubbles stored on the disk elements is obtained upon consecutively applying predetermined load and read signals to the control conductor 52. Thus only one pulse on the control conductor is necessary to replicate the entire error map onto the second leg 42. Thereafter a predetermined number of revolutions of drive field $H_r$ will bring the error map to the bubble detector 26 at which time reading of the error map can start immediately. This is to be contrasted with the bubble memory chip design in which the error map is stored in an extra minor loop on the chip. In this last mentioned design it is necessary to pulse a control conductor during many rotations of the drive field for each bit position in the error map. Furthermore, since the orientation of the error map within the loop is not known it is necessary to provide a leader on the error map which must be searched for by the detector before it can began reading the error map.

Clearly the parallel access to the error map afforded by the bubble memory chip of FIG. 1 results in less power consumption since only one pulse on the control conductor 52 is required to access the entire map. Furthermore, the position of the map when accessed from the disk elements is always fixed, and thereafter a predetermined number of revolutions of the drive field will being the error map to the bubble detector. This will eliminate the neccessity of having a leader at the beginning of the error map. Thus the bubble memory of FIG. 1 results in less power consumption and a lower access time. Furthermore, the intrinsic margin for bubbles circulating on the disk elements is much wider than for bubbles circulating in the minor loops.

The only potential difficulty in the approach of FIG. 1 arises from the required driver voltage necessary for the control conductor 52 that will cause the error map to be loaded and read from the disk elements. Because the control conductor 52 extends under a relatively large number of the permalloy disk elements a larger drive voltage will be required than if the error map were stored on a loop and the control conductor passed underneath only a single gate. This can be overcome by using a capacitive discharge or by subdividing the control conductor 52 into various segments which are then connected in parallel.

FIG. 2 illustrates in detail the construction of a portion of the error map storage region 12 of the bubble memory chip of FIG. 1. Specifically, the first and second legs 40 and 42 include a plurality of assymmetric chevron propagation elements 54 made of permalloy which are arranged in spaced apart, end to end linear fashion. At the location of the load gate 48-3 the first leg has a C-bar permalloy propagation element 56. The load and read gates 48-3 and 50-3 lead to and from the permalloy disk element 34-3. The control conductor 52 extends underneath the disk element 34-3 and underneath the C-bar 56 of the first leg 40. A bubble 36 is shown stored on the disk element 34-3 and it circulates about the periphery of the disk element in the direction indicated by the arrow. Pulsing the control conductor 52 with a suitable transfer-in or load signal while a bubble is positioned in the middle of the C-bar 56 causes it to jump onto the disk element 34-3. Subsequent pulsing of the control conductor 52 with a suitable replicate signal or read signal will cause the bubble on the disk element to be replicated and transferred along permalloy elements 57 of the read gate 50-3 to the leg 42.

FIG. 3 is a schematic diagram of an alternate embodiment of the error map storage region 12. In this figure components similar to those in the bubble memory chip of FIG. 1 are indicated with like reference numerals. An error map propagation path 58 having a generally C-shaped configuration connects with the serial portions of the input path 20 and the output path 28 of an information storage region of the block replicate architecture (not shown). The intermediate portion of the path 58 extends past the disk element 34-1 to 34-N. Single error map gates 60-1 to 60-N are provided for each transferring a single bubble between the path 58 and the disk elements. The error map control conductor 52 extends beneath each of the disk elements and the error map gates as shown. The error map is propagated around the path 58 until it is in alignment with the disk elements 34. Then a transfer-in or load signal is applied to the conductor 52 to transfer the bubbles from the path onto the disk elements by means of the gates 60.

In order to read the error map from the disk elements 34 in FIG. 3 a read or replicate control signal is applied to the control conductor 52 to cause the bubbles on the disk elements to be duplicated and transferred by means of the error maps gates 60-1 to 60-N onto the path 58. Thereafter the drive field is rotated to propagate the error map along the path 58 in an upward direction in FIG. 3. Preferably the path 58 is sufficiently long between the disk element 34-N and an extra transfer gate 62 so that the entire error map can be positioned therebetween. Thereafter a transfer signal is applied to the control conductor 52 during consecutive revolutions of the drive field so that each of the bubbles of the error map is transferred onto the upper leg portion 58a of the error map propagation path. Continued revolution of the drive field will propagate the error map to the bubble detector. An overflow bubble propagation path 64 extends from the transfer gate 62 to the guardrail of the bubble chip. Thus this second embodiment uses combined transfer and replicate switches to enable simultaneous parallel loading and reading of bubbles with respect to the disk elements.

Having described preferred embodiments of the present invention, it will be apparent to those skilled in the art that the invention permits of modification in both arrangement and detail. The disclosed error map storage region can be used with bubble memory information storage regions of various architectures other than the block replicate. For example it may be utilized in conjunction with the major-minor loop architecture exemplified in the Texas Instruments 92K-bit bubble memory chip. However, the invention should be limited only in accordance with the scope of the following claims.

I claim:

1. A magnetic bubble memory chip comprising:
    a plurality of data loops, some of which may be defective, for storing magnetic bubbles representative of data therein, the data loops including a plurality of permalloy propagation elements having a predetermined period;
    a serial-parallel input path for propagating bubbles to the data loops;
    a parallel-serial output path for propagating bubbles from the data loops;
    a plurality of permalloy disk elements arranged in spacedapart linear fashion, each of the disk elements having a diameter substantially equal to the predetermined period, there being an equal number of the data loops and the disk elements, each of the disk elements being adapted for having a single bubble circulated thereabout in the presence of an in-plane rotating magnetic field;
    an error map propagation path for propagating bubbles representative of an error map indicating which of the data loops are defective, including a first leg and a second leg, the legs extending past the disk elements on opposite sides thereof, the first leg having one end positioned for receiving bubbles from the serial portion of the serial-parallel input path, and the second leg having one end positioned for feeding bubbles onto the serial portion of the parallel-serial output path;
    a plurality of load gates each for transferring a single bubble from the first leg to one of the disk elements, there being an equal number of the load gates and the disk elements; and
    a plurality of read gates each for replicating a single bubble from one of the disk elements onto the second leg, therebeing an equal number of the read gates and the disk elements; and
    a control conductor extending adjacent the disk elements, the gates, and the legs of the error map propagation path so that simultaneous parallel storing of bubbles on the disk elements and thereafter simultaneous parallel access to bubbles stored on the disk elements is obtained upon consecutively applying predetermined load and read signals to the control conductor.

* * * * *